US012727473B2

(12) United States Patent
Kim et al.

(10) Patent No.: US 12,727,473 B2
(45) Date of Patent: Sep. 1, 2026

(54) DECOUPLING INTEGRATED CIRCUIT

(71) Applicant: Samsung Electronics Co., Ltd., Suwon-si (KR)

(72) Inventors: Yong Beom Kim, Bucheon-si (KR); Young Jin Cho, Hwaseong-si (KR); Hun Lim, Yongin-si (KR); Sam Yong Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 534 days.

(21) Appl. No.: 17/746,298

(22) Filed: May 17, 2022

(65) Prior Publication Data

US 2023/0075756 A1 Mar. 9, 2023

(30) Foreign Application Priority Data

Sep. 7, 2021 (KR) ........................ 10-2021-0119141

(51) Int. Cl.
*H10W 20/40* (2026.01)
*H10D 1/66* (2025.01)
(Continued)

(52) U.S. Cl.
CPC ............ *H10W 20/496* (2026.01); *H10D 1/66* (2025.01); *H10D 89/911* (2025.01); *H10W 20/427* (2026.01)

(58) Field of Classification Search
CPC ............. H01L 23/5223; H01L 23/5286; H01L 27/0288; H01L 29/94; H01L 27/0629;
(Continued)

(56) References Cited

U.S. PATENT DOCUMENTS 7,638,821 B2 12/2009 Aoki
8,188,516 B2 5/2012 Correale, Jr. et al.
(Continued)

FOREIGN PATENT DOCUMENTS

JP 2007-234857 A 9/2007

OTHER PUBLICATIONS

Korean Office Action dated Aug. 1, 2025 issued in Korean Patent Application No. 10-2021-0119141.
(Continued)

*Primary Examiner* — Julio J Maldonado
*Assistant Examiner* — Nathan Pridemore
(74) *Attorney, Agent, or Firm* — Harness, Dickey & Pierce, P.L.C.

(57) ABSTRACT

A decoupling integrated circuit including a substrate including first and second active regions extending in a first direction and spaced apart from each other in a second direction intersecting the first direction, a first power rail configured to receive a first power supply and including a first horizontal extension being apart from the first active region in the second direction and extending in the first direction and a first-1 protrusion protruding from the first horizontal extension in a third direction opposite to the second direction, a second power rail configured to receive a second power supply and including a second horizontal extension being apart from the second active region in the second direction and extending in the first direction and a second-1 protrusion protruding from the second horizontal extension in the second direction, the first-1 protrusion and the second-1 protrusion constituting a decoupling capacitor may be provided.

16 Claims, 18 Drawing Sheets

(51) Int. Cl.
*H10D 89/60* (2025.01)
*H10W 20/41* (2026.01)

(58) Field of Classification Search
CPC . H01L 27/0207; H01L 29/0673; H01L 23/50; H10D 89/911; H10D 89/10; H10D 1/66; H10D 84/811; H10D 84/813; H10D 84/817; H10D 62/121; H10D 1/692; H10W 20/496; H10W 20/427; H10W 20/435; H10W 72/00
See application file for complete search history.

(56) References Cited

U.S. PATENT DOCUMENTS 9,053,960 B2 6/2015 Kamal et al.
9,136,268 B2 9/2015 Oh et al.
9,293,606 B2 3/2016 Chen et al.
9,502,423 B2 11/2016 Kong et al.
10,615,157 B2 4/2020 Kong
2007/0252217 A1* 11/2007 Oki ...................... H10D 84/811 257/369
2009/0315079 A1 12/2009 Tien et al.
2012/0256680 A1* 10/2012 Nakanishi ........... H01L 23/5286 327/534
2013/0175589 A1* 7/2013 Chen .................. H01L 23/5223 257/296

OTHER PUBLICATIONS

Korean Notice of Allowance dated Apr. 12, 2026 issued in corresponding KR Patent Application No. 10-2021-0119141.

* cited by examiner

Figure 1:
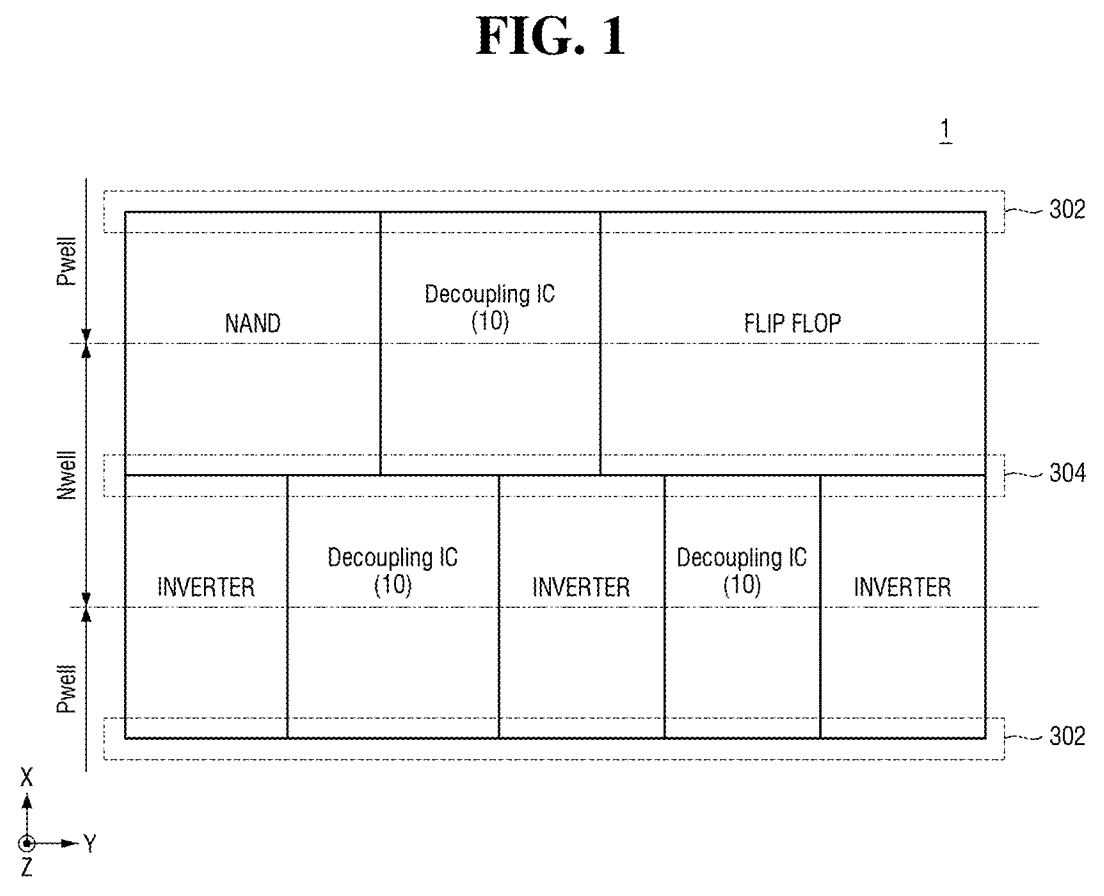

FLIP FLOP
Decoupling IC (10)
NAND
INVERTER
Decoupling IC (10)
INVERTER
Decoupling IC (10)
INVERTER Pwell
Nwell
Pwell

VDD
S
D
PMOS
GDCAP1
NMOS
S
D
GND 10
302a
302b
302c
302
304a
304b
304c
304
302c
DCAP3
304c
224
A'
212
222
L2
L4
200
DCAP2
NMOS
L1
L3
B
B'
210
214
220
PMOS
302a
100
A
ACT1
214
302b
ACT2
DCAP1
304b
304a
X
Y
Z

VDD
PMOS
NMOS
VSS 13
302a
302b
302c
302
304a
304b
304c
304
302c
DCAP3
224
304c
ML3
226
212
222
L2
L4
ML1
GC1
202
204
GC2
DCAP2
ML2
L1
L3
NMOS
210
220
PMOS
302a
100
ACT1
302b
214
ACT2
DCAP1
304b
304a
X
Y
Z 14
302a
302b
302c
302
304a
304b
304c
304
302c
DCAP3
224
304c
212
222
L2
L4
ML1
GC1
202
204
NMOS
DCAP2
GC2
ML2
L1
L3
210
220
PMOS
302a
100
ACT1
216
ML3
302b
214
ACT2
DCAP1
304b
304a
X
Y
Z

DECOUPLING INTEGRATED CIRCUIT

CROSS-REFERENCE TO RELATED APPLICATIONS

This application claims priority to Korean Patent Application No. 10-2021-0119141, filed on Sep. 7, 2021, and all the benefits accruing therefrom under 35 U.S.C. § 119, the disclosure of which is incorporated herein by reference in its entirety.

BACKGROUND

1. Field

The present inventive concepts relate to decoupling integrated circuits.

2. Description of the Related Art

In a semiconductor device including various integrated circuits, there are power rails for supplying various power supplies. The power rails may supply, for example, a power supply voltage to the semiconductor device. As another example, the power rail may supply a ground voltage to the semiconductor device. At this time, noise generated from the power rail or unwanted signals may be transmitted to the integrated circuit inside the semiconductor device.

Therefore, in order to prevent noise or unwanted signals from being transmitted to the integrated circuit inside the semiconductor device, a decoupling integrated circuit may be placed at a position other than a position at which the integrated circuits are placed inside the semiconductor device. The decoupling integrated circuit is placed around the integrated circuits inside the semiconductor device, prevents unwanted DC signals from passing through the integrated circuits, and may help the noise formed in an AC signal exit to the ground power supply.

There is a need for increasing the decoupling capacity to improve the decoupling performance of the decoupling integrated circuit.

SUMMARY

Some example embodiments of the present inventive concepts provide a decoupling integrated circuit having improved decoupling performance.

However, example embodiments of the present inventive concept are not restricted to the one set forth herein. The above and other aspects of the present inventive concepts will become more apparent to one of ordinary skill in the art to which the present inventive concepts pertain by referencing the detailed description of some example embodiments given below.

According to an example embodiment, a decoupling integrated circuit may include a substrate including a first active region and a second active region, the first active region extending in a first direction, the second active region extending in the first direction and being spaced apart from the first active region in a second direction, the second direction intersecting the first direction, a first power rail including a first power rail horizontal extension and a first-1 power rail protrusion and configured to receive a first power supply, the first power rail horizontal extension being apart from the first active region in the second direction and extending in the first direction, the first-1 power rail protrusion protruding from the first power rail horizontal extension in a third direction opposite to the second direction, and a second power rail including a second power rail horizontal extension and a second-1 power rail protrusion and configured to receive a second power supply different from the first power supply, the second power rail horizontal extension being apart from the second active region in the second direction and extending in the first direction, the second-1 power rail protrusion protruding from the second power rail horizontal extension in the second direction. The first-1 power rail protrusion may overlap the first active region, and the second-1 power rail protrusion may overlap at least a part of the second active region to provide a first decoupling capacitor between the first-1 power rail protrusion and the second-1 power rail protrusion.

According to an example embodiment, a decoupling integrated circuit may include a substrate including a first active region and a second active region, the first active region extending in a first direction, the second active region extending in the first direction, and being spaced apart from the first active region in a second direction, the second direction intersecting the first direction, a first power rail including a first power rail horizontal extension and a first-1 power rail protrusion and configured to receive a first power supply, the first power rail horizontal extension being apart from the first active region in the second direction and extending in the first direction, the first-1 power rail protrusion protruding from the first power rail horizontal extension in a third direction opposite to the second direction, and a second power rail including a second power rail horizontal extension and a second-1 power rail protrusion and configured to receive a second power supply different from the first power supply, the second power rail horizontal extension being apart from the second active region in the second direction and extending in the first direction, the second-1 power rail protrusion protruding from the second power rail horizontal extension in the second direction. The first-1 power rail protrusion may overlap the first active region, the second-1 power rail protrusion may overlap the second active region, the first-1 power rail protrusion and the second-1 power rail protrusion may be spaced apart in the first direction, and the first-1 power rail protrusion and the second-1 power rail protrusion may at least partially overlap each other to provide a first decoupling capacitor.

According to an example embodiment, a decoupling integrated circuit may include a substrate including a first active region and a second active region, the first active region extending in a first direction, the second active region extending in the first direction, and being spaced apart from the first active region in a second direction, the second direction intersecting the first direction, a first power rail including a first power rail horizontal extension and a first-1 power rail protrusion and configured to receive a first power supply, the first power rail horizontal extension being apart from the first active region in the second direction and extending in the first direction, the first-1 power rail protrusion protruding from the first power rail horizontal extension in a third direction opposite to the second direction, and a second power rail including a second power rail horizontal extension, a second-1 power rail protrusion and a second-2 power rail protrusion and configured to receive a second power supply different from the first power supply, the second power rail horizontal extension being apart from the second active region in the second direction and extending in the first direction, the second-1 power rail protrusion protruding from the second power rail horizontal extension in the second direction, the second-2 power rail protrusion protruding from the second power rail horizontal extension in the second direction and being spaced apart from the second-1 power rail protrusion in the first direction. The first-1 power rail protrusion may overlap the first active region, the second-1 power rail protrusion may overlap the second active region, the second-1 power rail protrusion may overlap at least a part of the second active region and may be spaced apart from the first-1 power rail protrusion in the second direction to provide a first decoupling capacitor between the first-1 power rail protrusion and the second-1 power rail protrusion, and the second-2 power rail protrusion overlaps the second active region, the first-1 power rail protrusion and the second-2 power rail protrusion are spaced apart in the first direction, and the first-1 power rail protrusion and the second-2 power rail protrusion at least partially overlap each other to provide a second decoupling capacitor

BRIEF DESCRIPTION OF THE DRAWINGS

The above and other aspects and features of the present inventive concepts will become more apparent by describing in detail some example embodiments thereof with reference to the attached drawings, in which:

FIG. 1 is a block diagram showing a semiconductor device including a decoupling integrated circuit according to some example embodiments.

FIG. 2 is a circuit diagram showing a decoupling integrated circuit.

FIGS. 6 to 10 are layout diagrams showing some layers of the decoupling integrated circuit of FIG. 3.

FIG. 15 is a circuit diagram showing another decoupling integrated circuit.

DETAILED DESCRIPTION

Figure 3:
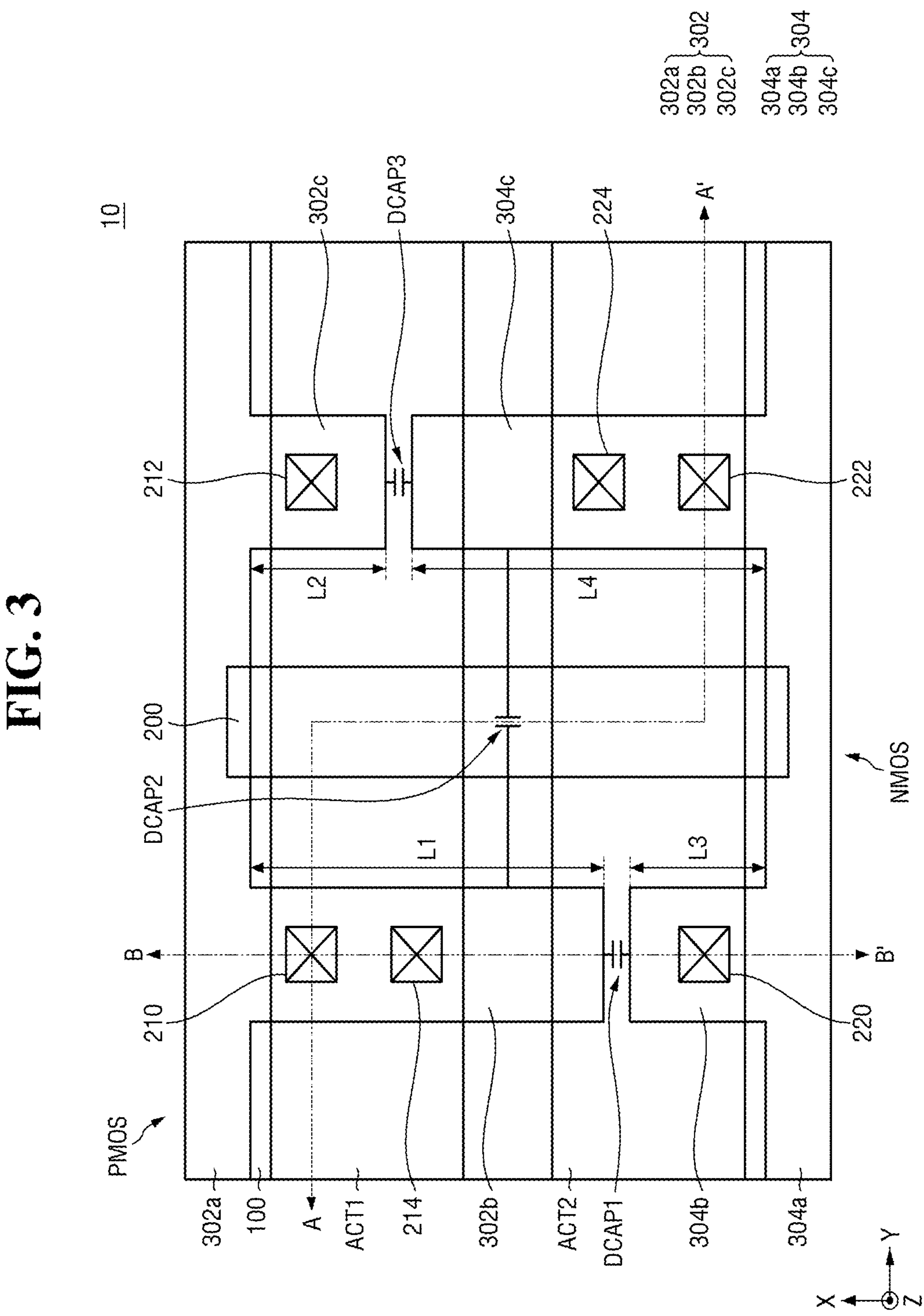
FIGS. 3 to 5 are layout diagrams showing the decoupling integrated circuit that is configured to increase a decoupling capacity, according to some example embodiments.

FIG. 1 is a block diagram showing a semiconductor device including a decoupling integrated circuit according to some example embodiments.

Referring to FIG. 1, a semiconductor device 1 may include a decoupling integrated circuit 10.

For example, the semiconductor device 1 may include a memory (e.g., NAND flash memory (NAND), a flip-flop circuit (FLIP FLOP), and/or an inverter (INVERTER)).

The example of the integrated circuit included in the semiconductor device 1 is not limited to the drawing. For example, although not shown in this drawing, the semiconductor device 1 may include a master-slave flip-flop.

Each integrated circuit may include a P-well and an N-well.

The decoupling integrated circuit 10 may be placed in a space that remains after various integrated circuits are placed. The decoupling integrated circuit 10 may mitigate or prevent noise generated from the first power rail 302 and/or the second power rail 304 from entering other integrated circuits. Further, the decoupling integrated circuit 10 may mitigate or prevent unwanted signals generated from the first power rail 302 and/or the second power rail 304 from penetrating other integrated circuits.

For example, the decoupling integrated circuit 10 that serves as a decoupling capacitor that filters unwanted noise DC signals, and may cause noise, which is an AC component, to flow to a grounded power supply (e.g., a second power rail 304).

Further, in the decoupling integrated circuit 10, the decoupling capacity per unit area should be increased to reduce a dynamic voltage drop of various integrated circuits.

For this purpose, structural changes of the first power rail 302 and the second power rail 304 may be performed to increase the decoupling capacity of the decoupling integrated circuit 10 according to some example embodiments.

First, a decoupling integrated circuit that serves as a decoupling capacitor will be described using a circuit diagram.

Figure 2:
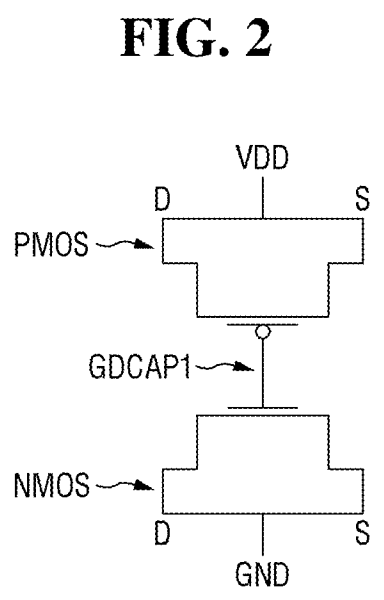

FIG. 2 is a circuit diagram showing a decoupling integrated circuit.

Referring to FIGS. 1 and 2, the decoupling integrated circuit includes an NMOS and a PMOS.

A source/drain of the PMOS is connected to a power supply voltage (e.g., a first power rail 302). Further, the body of the PMOS may also be connected to the power supply voltage (e.g., the first power rail 302).

The source/drain of the NMOS is connected to a ground voltage (e.g., a second power rail 304). Further, the body of the NMOS may also be connected to the ground voltage (e.g., the second power rail 304).

Further, the gates of the PMOS and the NMOS may be connected.

In the decoupling integrated circuit of FIG. 2, because only the capacitors formed at the gates of the PMOS and the NMOS serve as the decoupling capacitor, the decoupling capacitor may be small. Therefore, in order to increase the decoupling capacity of the decoupling integrated circuit of FIG. 2, the structure of the power supply voltage (e.g., the first power rail 302) and/or the ground voltage (e.g., the second power rail 304) may be modified.

The decoupling integrated circuit according to some example embodiments in which the structure of the first power rail 302 and/or the second power rail 304 are modified to increase the decoupling capacity will be explained using a layout diagram of FIG. 3.

Figure 4:
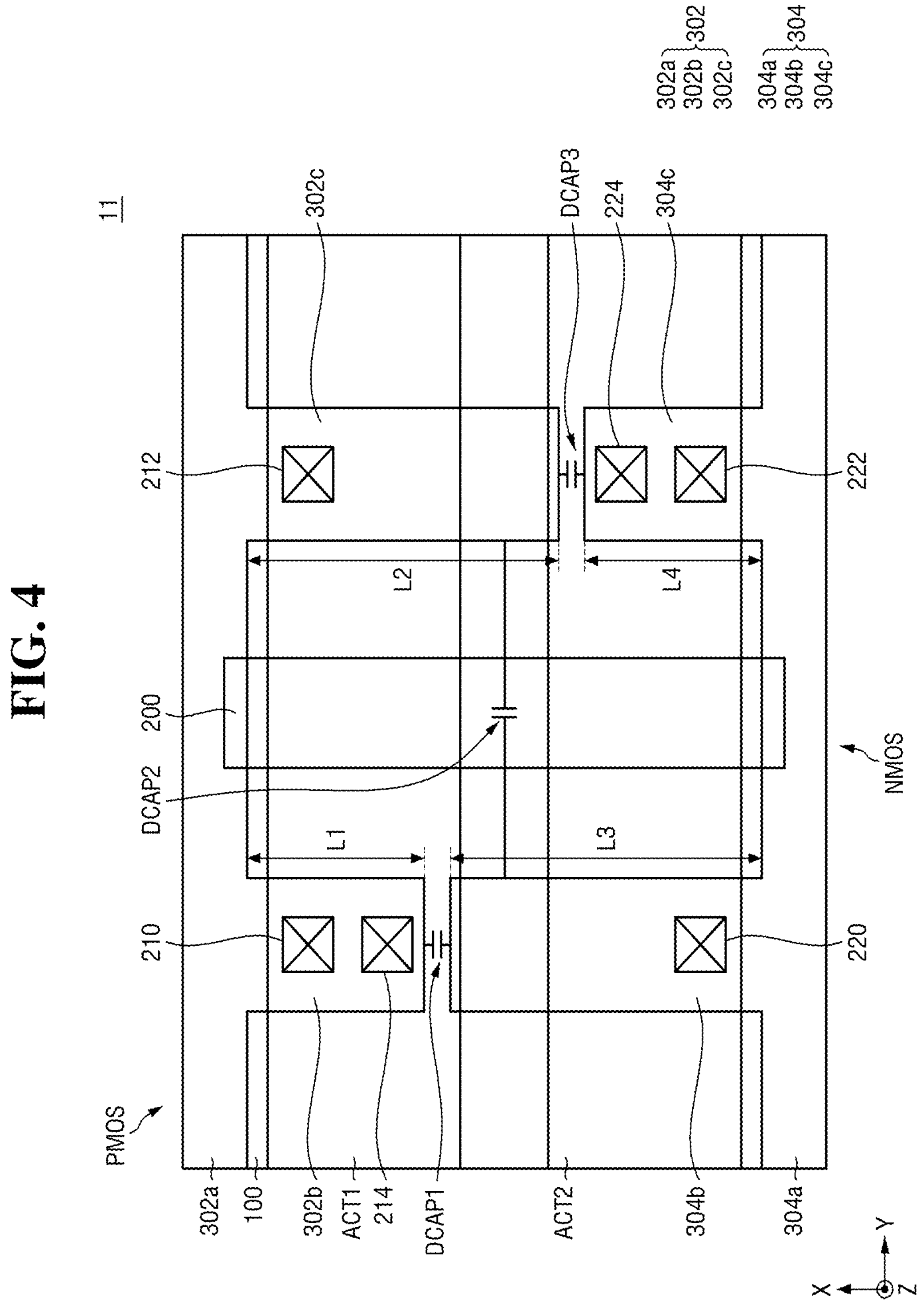
Figure 5:
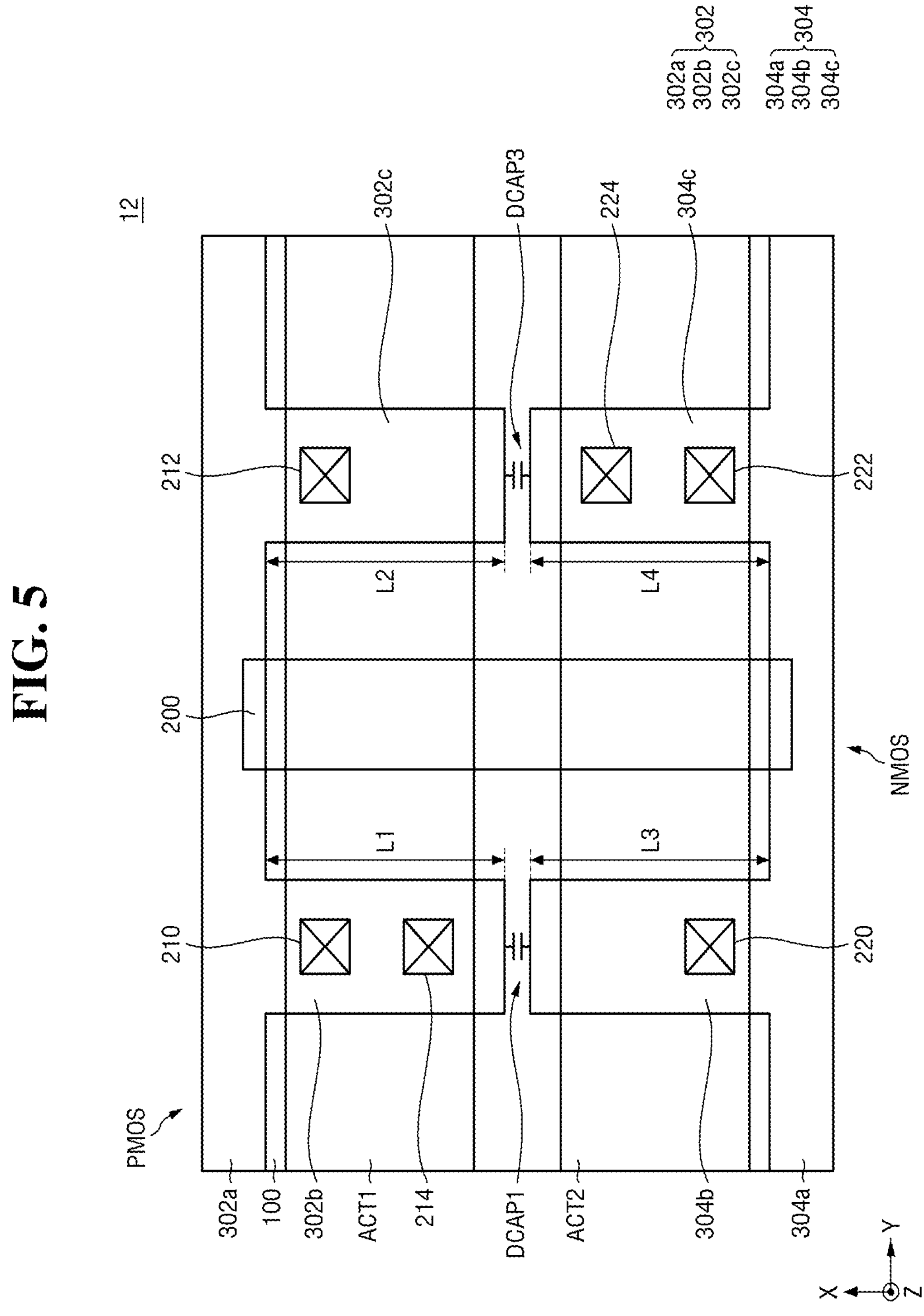

FIGS. 3 to 5 are layout diagrams showing the decoupling integrated circuit that is configured to increase a decoupling capacity, according to some example embodiments.

Because the description of FIG. 3 is also applicable to FIGS. 4 and 5, the description will be made focusing on FIG. 3. For the sake of simplicity, the description of FIGS. 4 and 5 will be provided only on the basis of differences from those of FIG. 3.

Referring to FIG. 3, a PMOS transistor may be formed on a first active region ACT1 extending in a first direction y. Further, an NMOS transistor may be formed on a second active region ACT2 extending in the first direction y. The second active region ACT2 may be placed apart from the first active region ACT1 in a second direction x intersecting the first direction y.

For reference, although not shown, a first active pin protruding from the first active region ACT1 in a third direction z may be formed on the first active region ACT1. Further, a second active pin protruding from the second active region ACT2 in the third direction z may be formed on the second active region ACT2.

The decoupling integrated circuit 10 includes a gate structure 200, which overlaps the first active region ACT1 and the second active region ACT2 in the first active region ACT1 and the second active region ACT2, respectively. That is, the gate structure 200 is placed on the first active region ACT1 and on the second active region ACT2, and forms a structure by which the gate of the PMOS transistor PMOS and the gate of the NMOS transistor NMOS are connected to each other.

At this time, a MOS capacitor that serves as a decoupling capacitor may be formed under the gate structure 200. Because the decoupling capacity may not be increased only by the decoupling capacitor formed through the gate structure 200, according to some example embodiments described below, the decoupling integrated circuit 10 may modify the structure of the first power rail 302 and/or the second power rail 304 to increase the decoupling capacity.

Referring to FIG. 3, the decoupling integrated circuit 10 includes a first power rail 302 that is spaced apart from the first active region ACT1 in the second direction x and extends in the first direction y. For example, a power supply voltage VDD may be applied through the first power rail 302.

The first power rail 302 includes a first power rail horizontal extension 302*a* extending in the first direction y. Further, the first power rail 302 includes a first-1 power rail protrusion 302*b* protruding from first power rail horizontal extension 302*a* in a direction-x opposite to the second direction x. Further, the first power rail 302 includes a first-2 power rail protrusion 302*c* that protrudes from the first power rail horizontal extension 302*a* in the direction-x opposite to the second direction x and is spaced apart from the first-1 power rail protrusion 302*b* in the second direction y.

Further, the decoupling integrated circuit 10 includes a second power rail 304. A voltage (e.g., a ground voltage GND) different from the voltage applied to the first power rail 302 may be applied through the second power rail 304.

The second power rail 304 includes a second power rail horizontal extension 304*a* extending in the first direction y and placed apart from the second active region ACT2 in the second direction x. Further, the second power rail 304 includes a second-1 power rail protrusion 304*b* that protrudes from the second power rail horizontal extension 304*a* in the second direction x. Further, the second power rail 304 includes a second-2 power rail protrusion 304*c* which protrudes from the second power rail horizontal extension 304*a* in the second direction x and is spaced apart from the second-1 power rail protrusion 304*b* in the first direction y.

The first-1 power rail protrusion 302*b* may have a first length L1 from the first power rail horizontal extension 302*a* in the second direction x. Further, the first-2 power rail protrusion 302*c* may have a second length L2 from the first power rail horizontal extension 302*a* in the second direction x. Further, the second-1 power rail protrusion 304*b* may have a third length L3 from the second power rail horizontal extension 304*a* in the second direction x. Further, the second-2 power rail protrusion 304*c* may have a fourth length L4 in the second direction x from the second power rail horizontal extension 304*a*. The first length L1 to the fourth length L4 may be different from each other, may be the same as each other, or at least some of the lengths may be the same as each other.

The first length L1 and the third length L3 may be different from each other. For example, the first length L1 may be longer than the third length L3. For example, the first-1 power rail protrusion 302*b* may overlap all or a part of the first active region ACT1 and/or the second active region ACT2.

Further, the second-1 power rail protrusion 304*b* may overlap at least a part of the second active region ACT2. That is, a first decoupling capacitor DCAP1 may be formed through a portion (the first-1 power rail protrusion 302*b*) to which power is supplied through the first power rail 302 and a portion (the second-1 power rail protrusion 304*b*) to which ground power is supplied through the second power rail 304. At this time, the first decoupling capacitor DCAP1 may be formed on the second active region ACT2. However, the present inventive concepts are not limited thereto. According to some example embodiments, the first decoupling capacitor DCAP1 may be formed in a space between the first active region ACT1 and the second active region ACT2 or on the first active region ACT1.

Referring to the decoupling integrated circuit 11 of FIG. 4, The third length L3 may be longer than the first length L1. In this example embodiment, the first-1 power rail protrusion 302*b* may overlap at least a part of the first active region ACT1.

Further, the second-1 power rail protrusion 304*b* may overlap all or a part of the second active region ACT2 and/or the first active region ACT1. That is, the first decoupling capacitor DCAP1 may be formed through the a portion (the first-1 power rail protrusion 302*b*) to which power is supplied through the first power rail 302 and a portion (the second-1 power rail protrusion 304*b*) to which ground power is supplied through the second power rail 304. At this time, the first decoupling capacitor DCAP1 may be formed on the first active region ACT1. However, the present inventive concepts are not limited thereto. According to some example embodiments, the first decoupling capacitor DCAP1 may be formed in the space between the first active region ACT1 and the second active region ACT2 or on the second active region ACT2.

Referring to the decoupling integrated circuit 12 of FIG. 5, The first length L1 and the third length L3 may be the same. In this example embodiment, the first-1 power rail protrusion 302*b* may overlap the first active region ACT1.

Further, the second-1 power rail protrusion 304*b* may overlap the second active region ACT2. That is, the first decoupling capacitor DCAP1 may be formed through a portion (the first-1 power rail protrusion 302*b*) to which power is supplied through the first power rail 302 and a portion (the second-1 power rail protrusion 304*b*) to which ground power is supplied through the second power rail 304. At this time, the first decoupling capacitor DCAP1 may be formed on the space between the first active region ACT1 and the second active region ACT2. However, the present inventive concepts are not limited thereto. According to some example embodiments, the first decoupling capacitor DCAP1 may be formed on the first active region ACT1 or the second active region ACT2, without being limited thereto.

Referring to FIG. 3 again, the second length L2 and the fourth length L4 may be different from each other. For example, the fourth length L4 may be longer than the second length L2. For example, the second-2 power rail protrusion 304*c* may overlap all or at least a part of the second active region ACT2 and/or the first active region ACT1.

Further, the first-2 power rail protrusion 302*c* may overlap at least a part of the first active region ACT1. That is, a third decoupling capacitor DCAP3 may be formed through a portion (the first-2 power rail protrusion 302*c*) to which power is supplied through the first power rail 302 and a portion (the second-2 power rail protrusion 304*c*) to which ground power is supplied through the second power rail 304. At this time, the third decoupling capacitor DCAP3 may be formed on the first active region ACT1. However, the present inventive concepts are not limited thereto. According to some example embodiments, the third decoupling capacitor DCAP3 may be formed in the space between the first active region ACT1 and the second active region ACT2 or on the second active region ACT2.

Referring to the decoupling integrated circuit 11 of FIG. 4, the second length L2 may be longer than the fourth length L4. In this example embodiment, the second-2 power rail protrusion 304*c* may overlap at least a part of the second active region ACT2.

Further, the first-2 power rail protrusion 302*c* may overlap all or a part of the first active region ACT1 and/or the second active region ACT2. That is, the third decoupling capacitor DCAP3 may be formed through a portion (the first-2 power rail protrusion 302*c*) to which power is supplied through the first power rail 302 and a portion (the second-2 power rail protrusion 304*c*) to which ground power is supplied through the second power rail 304. At this time, the third decoupling capacitor DCAP3 may be formed on the second active region ACT2. However, the present inventive concepts are not limited thereto. According to some example embodiments, the third decoupling capacitor DCAP3 may be formed in the space between the first active region ACT1 and the second active region ACT2 or on the first active region ACT1

Referring to the decoupling integrated circuit 12 of FIG. 5, the second length L2 and the fourth length L4 may be the same. In this example embodiment, the first-2 power rail protrusion 302*c* may overlap the first active region ACT1 and/or the second active region ACT2.

In some example embodiments, the second-2 power rail protrusion 304*c* may overlap the second active region ACT2 and/or the first active region ACT1. That is, the third decoupling capacitor DCAP3 may be formed through a portion (the first-2 power rail protrusion 302*c*) to which power is supplied through the first power rail 302 and a portion (the second-2 power rail protrusion 304*c*) to which ground power is supplied through the second power rail 304. At this time, the third decoupling capacitor DCAP3 may be formed in the space between the first active region ACT1 and the second active region ACT2, on the first active region ACT1 or on the second active region ACT2.

Referring to FIG. 3 again, there may be a region in which the first-1 power rail protrusion 302*b* and the second-2 power rail protrusion 304*c* overlap each other. That is, a second decoupling capacitor DCAP2 may be formed through a portion (the first-1 power rail protrusion 302*b*) to which power is supplied through the first power rail 302 and a portion (the second-2 power rail protrusion 304*c*) to which ground power is supplied through the second power rail 304. At this time, the second decoupling capacitor DCAP2 may be formed on the space between the first active region ACT1 and the second active region ACT2. However, the present inventive concepts are not limited thereto. According to some example embodiments, the second decoupling capacitor DCAP2 may be formed on the first active region ACT1 or on the second active region ACT2.

Further, referring to FIG. 4, there may be a region in which the second-1 power rail protrusion 304*b* and the first-2 power rail protrusion 302*c* overlap each other. That is, the second decoupling capacitor DCAP2 may be formed through a portion (the first-2 power rail protrusion 302*c*) to which power is supplied through the first power rail 302 and a portion (the second-1 power rail protrusion 304*b*) to which ground power is supplied through the second power rail 304. At this time, the second decoupling capacitor DCAP2 may be formed on the space between the first active region ACT1 and the second active region ACT2. However, the present inventive concepts are not limited thereto. According to some example embodiments, the second decoupling capacitor DCAP2 may be formed on the first active region ACT1 or on the second active region ACT2.

Referring to FIGS. 3 and 4 again, in the decoupling integrated circuits 10 and 11 according to some example embodiments, additional decoupling capacitors (the first decoupling capacitor DCAP1, the second decoupling capacitor DCAP2, and the third decoupling capacitor DCAP3) are formed through the first power rail 302 and the second power rail 304, in addition to the decoupling capacitor formed through the gate structure 200, the decoupling capacity may be increased.

Further, referring to FIG. 5, in the decoupling integrated circuit 12 according to some example embodiments, because additional decoupling capacitors (the first decoupling capacitor DCAP1 and the third decoupling capacitor DCAP3) are formed through the first power rail 302 and the second power rail 304, in addition to the decoupling capacitor formed through the gate structure 200, the decoupling capacity may be increased.

Subsequently, referring to FIGS. 3 to 5, the decoupling integrated circuits 10, 11 and 12 may include source/drain vias 210 and 212 and a body contact 214 that are electrically connected to the first power rail 302, supplied with power, and the extends in the third direction z. Further, the decoupling integrated circuits 10, 11 and 12 may include source/drain vias 220 and 222 and a body contact 224 that are electrically connected to the second power rail 304, supplied with ground power, and extend in the third direction z.

The layout diagram of the semiconductor device 10 according to some example embodiments will be described by dividing it into some layers.

FIGS. 6 to 10 are layout diagrams showing some layers of the decoupling integrated circuit of FIG. 3. For reference, it goes without saying that the description of FIGS. 6 to 10 may be applied to FIGS. 4 and 5.

Figure 6:
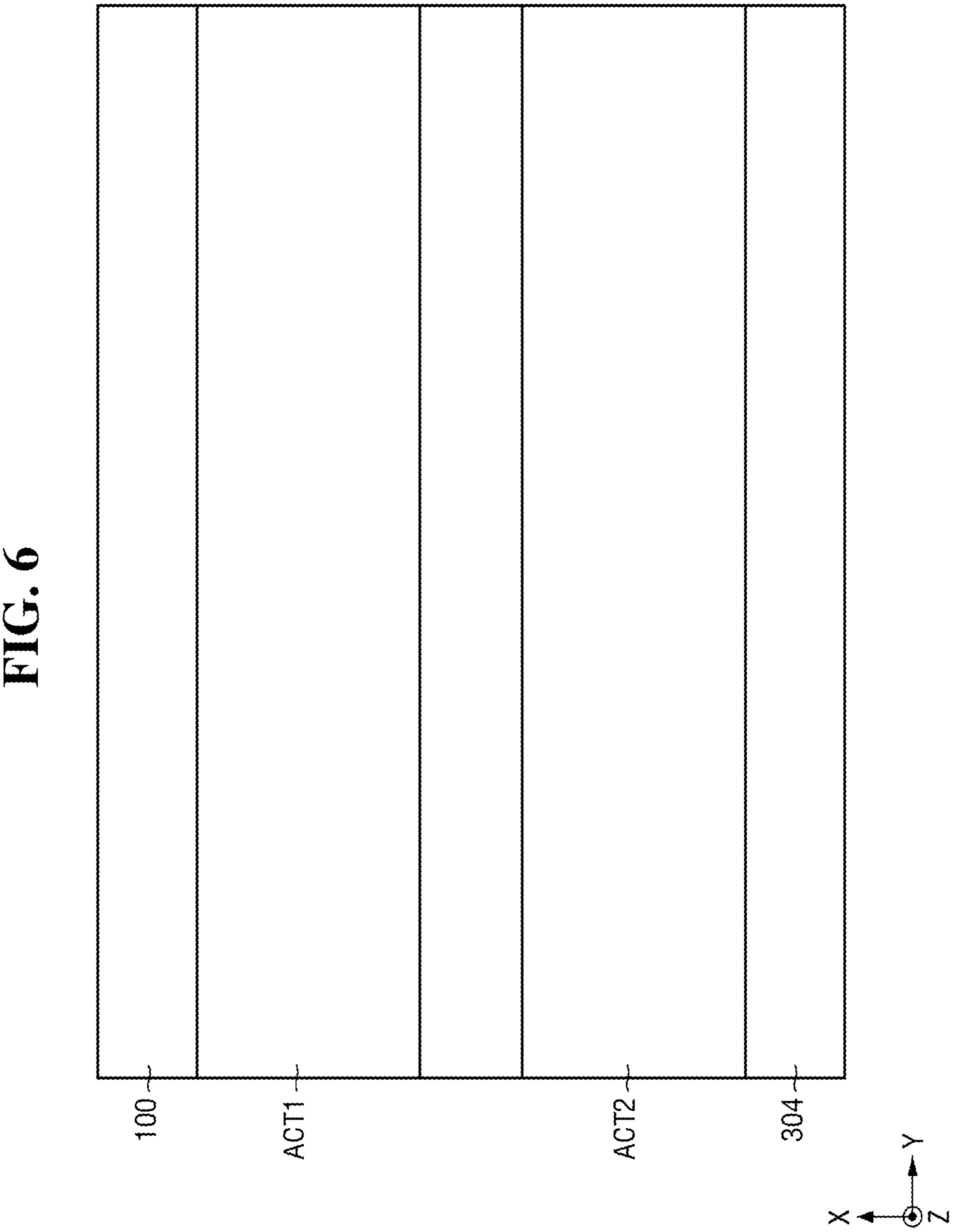

FIG. 6 is a layout diagram schematically showing some layers (e.g., FEOL (Front-End-Of-Line)) of FIG. 3.

In some layers of the decoupling integrated circuit 10, the first active region ACT1 and the second active region ACT2 extending in the first direction y are placed to be spaced apart from each other in the second direction x.

The first active region ACT1 may be a region in which a p-type transistor is formed. The first active region ACT1 may include, for example, a well region doped with n-type impurities. The second active region ACT2 may be a region in which an n-type transistor is formed. The second active region ACT2 may include, for example, a well region doped with p-type impurities.

Although not shown, a first active pin protruding from the first active region ACT1 in the third direction z may be formed on the first active region ACT1. Further, a second active pin protruding from the second active region ACT2 in the third direction z may be formed on the second active region ACT2. The first active pin and the second active pin may be formed to be spaced apart from each other in the second direction x. Further, the first active pin and the second active pin may each extend in the first direction y.

Figure 7:
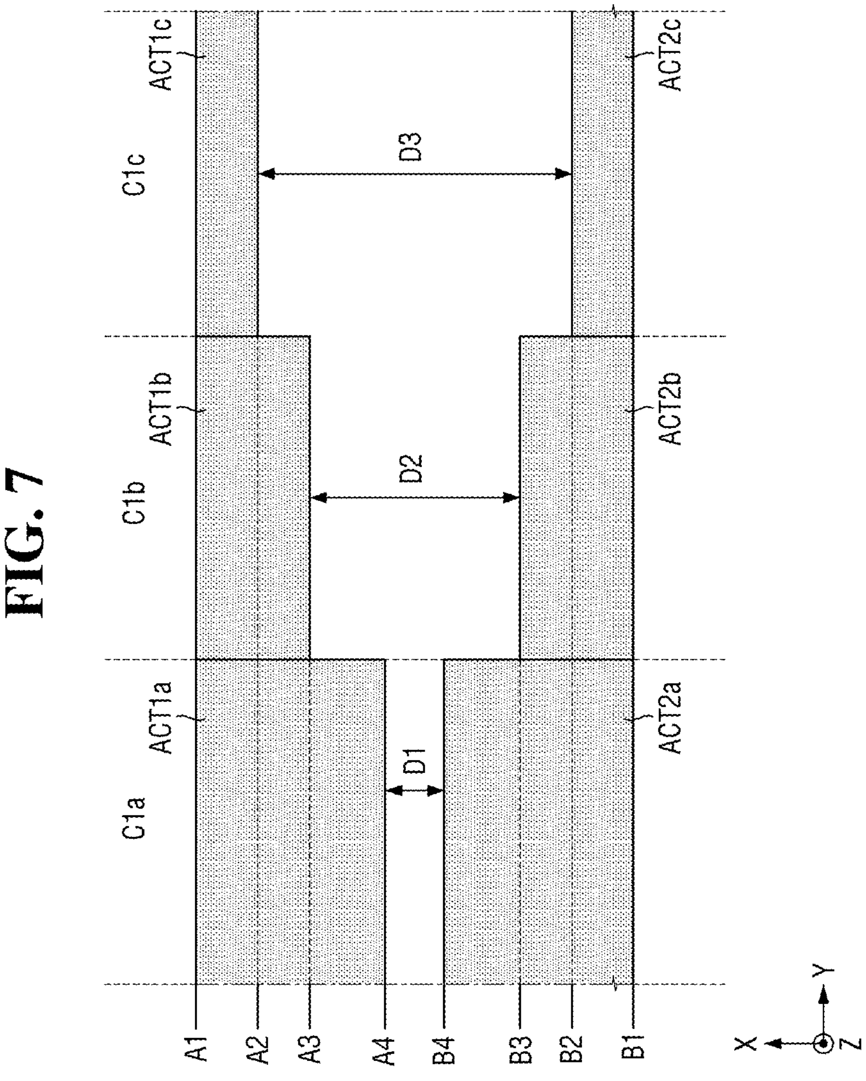

Referring to FIG. 7, the thicknesses in the second directions x of each active region in the plurality of cells (e.g., a $1a^{th}$ cell C1*a* to a $1c^{th}$ cell C1*c*) may be different from each other.

For example, a $1a^{th}$ active region ACT1*a* of the $1a^{th}$ cell C1*a* may be formed from an A1 boundary of the $1a^{th}$ cell C1*a* to an A4 boundary spaced apart from a $2a^{th}$ active region ACT2*a*. Similarly, the $2a^{th}$ active region ACT2*a* of the $1a^{th}$ cell C1*a* may be formed from a B1 boundary of the $1a^{th}$ cell C1*a* to a B4 boundary spaced apart from the $1a^{th}$ active region ACT1*a*. That is, the $1a^{th}$ active region ACT1*a* and the $2a^{th}$ active region ACT2*a* may be placed apart from each other in the second direction x by the first length D1.

A $1b^{th}$ active region ACT1*b* of a $1b^{th}$ cell C1*b* adjacent to the $1a^{th}$ cell C1*a* may be formed from the A1 boundary of the $1b^{th}$ cell C1*b* to an A3 boundary spaced apart from the $2b^{th}$ active region ACT2*b*. Similarly, the $2b^{th}$ active region ACT2*b* of the $1b^{th}$ cell C1*b* may be formed from the B1 boundary of the $1b^{th}$ cell C1*b* to the B3 boundary spaced apart from the $1b^{th}$ active region ACT1*b*. That is, the $1b^{th}$ active region ACT1*b* and the $2b^{th}$ active region ACT2*b* may be placed apart from each other in the second direction x by a second length D2.

A $1c^{th}$ active region ACT1*c* of a $1c^{th}$ cell C1*c* adjacent to the $1b^{th}$ cell C1*b* may be formed from the A1 boundary of the $1c^{th}$ cell C1*c* to the A2 boundary spaced apart from the $2c^{th}$ active region ACT2*c*. Similarly, the $2c^{th}$ active region ACT2*c* of the $1c^{th}$ cell C1*c* may be formed from the B1 boundary of the $1c^{th}$ cell C1*c* to the B2 boundary spaced apart from the $1c^{th}$ active region ACT1*c*. That is, the $1c^{th}$ active region ACT1*c* and the $2c^{th}$ active region ACT2*c* may be placed apart from each other in the second direction x by the third length D3.

The form and arrangement of the active region placed in the consecutive cells are not limited to this drawing.

Figure 8:
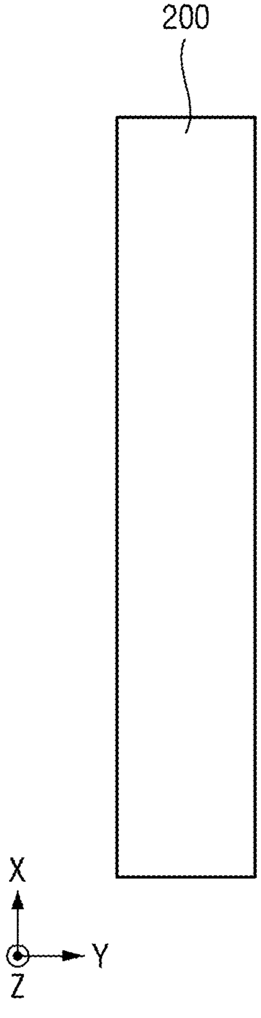

Referring to FIG. 8, it is a layout diagram schematically showing a layer of FIG. 3 (e.g., MOL (Middle-Of-Line)).

Although this drawing shows the single gate structure 200, the present inventive concepts are not limited thereto, and a plurality of gate structures 200 may be placed in the decoupling integrated circuit 10.

Although a plurality of sources/drains are not shown in this drawing, a plurality of sources/drains may be placed apart from each other in the first direction y.

The gate structure 200 and the source/drain may be placed apart from each other by 1 CPP (contacted poly pitch) in the first direction y. Further, each of the plurality of sources/drains may be placed apart from each other by 1 CPP in the first direction y.

Figure 9:
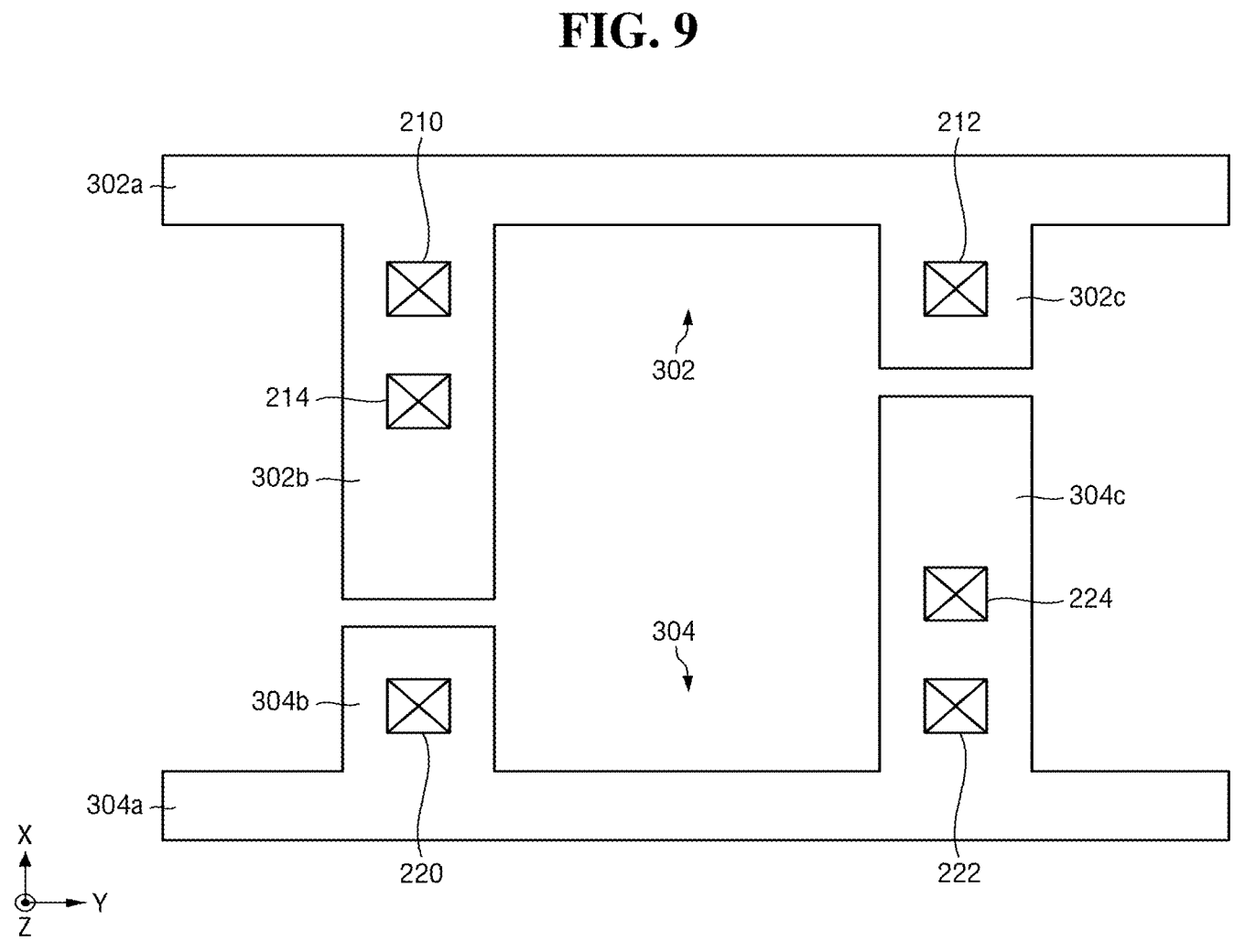

Referring to FIG. 9, it is a layout diagram schematically showing some layers (BEOL (Back-End-Of-Line)) of FIG. 3.

The first power rail 302 includes a first power rail horizontal extension 302*a* extending in the first direction y. Further, the first power rail 302 includes a first-1 power rail protrusion 302*b* that protrudes from the first power rail horizontal extension 302*a* in the direction-x opposite to the second direction x. Further, the first power rail 302 includes a first-2 power rail protrusion 302*c* that protrudes from the first power rail horizontal extension 302*a* in the direction-x opposite to the second direction x, and is spaced apart from the first-1 power rail protrusion 302*b* in the second direction y.

The second power rail 304 includes a second power rail horizontal extension 304*a* extending in the first direction y. Further, the second power rail 304 includes a second-1 power rail protrusion 304*b* that protrudes from the second power rail horizontal extension 304*a* in the second direction x. Further, the second power rail 304 includes a second-2 power rail protrusion 304*c* that protrudes from the second power rail horizontal extension 304*a* in the second direction x, and is spaced apart from the second-1 power rail protrusion 304*b* in the first direction y.

Further, source/drain vias 210 and 212 electrically connected between the first power rail 302 and the source/drain and extending in the third direction z are placed. Further, a body contact 214 electrically connected between the body of the PMOS transistor and the first power rail 302 is placed.

Further, source/drain vias 220/222 electrically connected between the second power rail 304 and the source/drain and extending in the third direction z are placed. Further, a body contact 224 electrically connected between the body of the NMOS transistor and the second power rail 304 may be placed.

Although this drawing only shows that the same layer on which the first power rail 302 and the second power rail 304 are placed is a single layer, the decoupling integrated circuit according to some example embodiments is not limited thereto, and different power rails may be placed on the first power rail 302 and the second power rail 304. This will be explained in detail in connection with FIG. 10.

Figure 10:
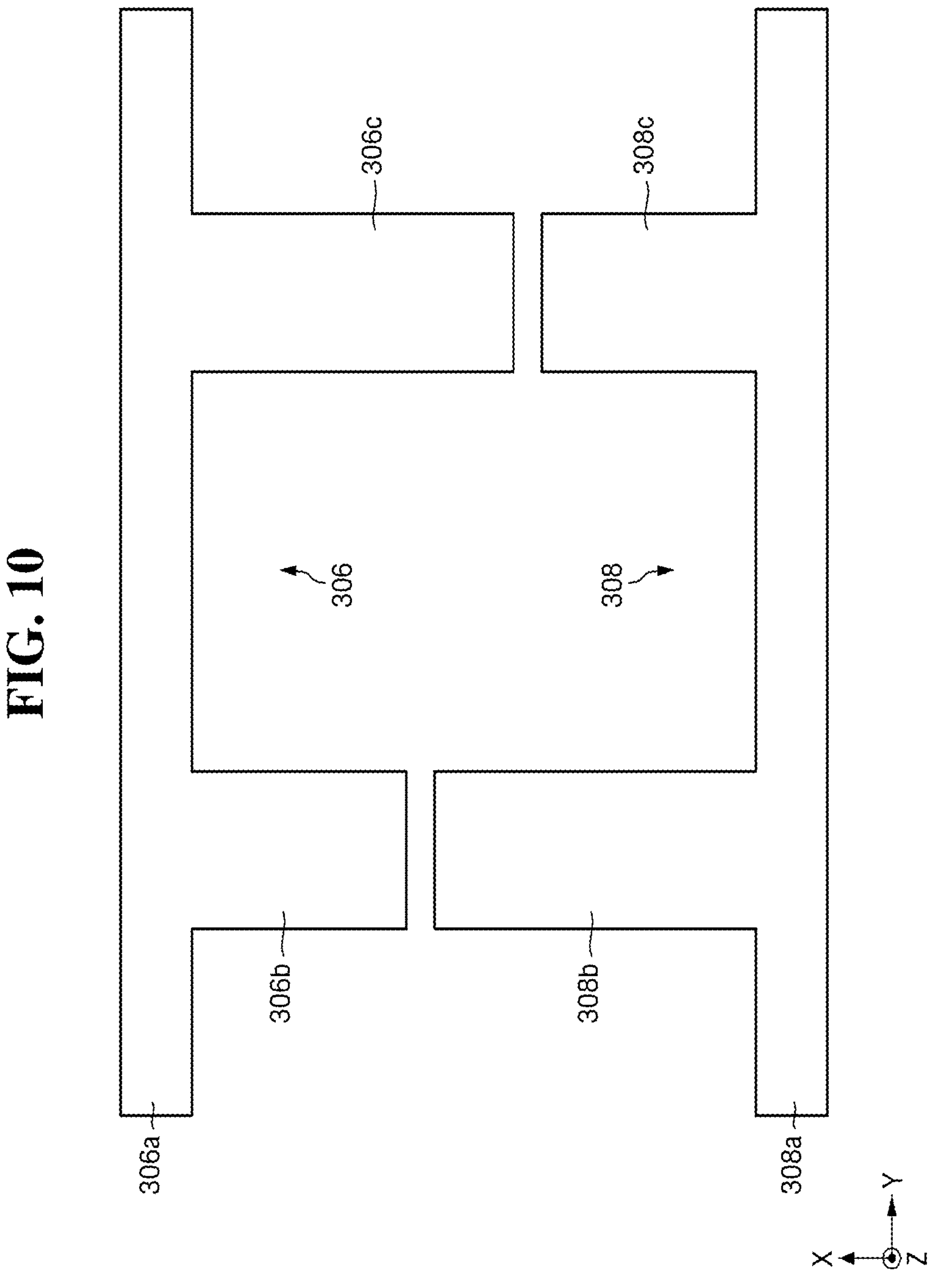

Referring to FIG. 10, a layer (e.g., a second layer) in which a third power rail 306 and a fourth power rail 308 are placed in the third direction z may be further included on a layer (e.g., a first layer) in which the first power rail 302 and the second power rail 304 of FIG. 9 are placed.

For reference, it goes without saying that the layer of the power rails placed in the third direction z on the layer (e.g., the first layer) in which the first power rail 302 and the second power rail 304 are placed is not limited to the second layer, but a third layer, a fourth layer, or the like may be added.

For example, the third power rail 306 may be placed on the first power rail 302 in the third direction z, and the fourth power rail 308 may be placed on the second power rail 304 in the third direction z.

The third power rail 306 includes a third power rail horizontal extension 306*a* extending in the first direction y. The third power rail 306 includes a third-1 power rail protrusion 306*b* and a third-2 power rail protrusion 306*c* that protrude in the opposite direction-x to the second direction x from the third power rail horizontal extension 306*a*. The fourth power rail 308 includes a fourth power rail horizontal extension 308*a* extending in the first direction y. The fourth power rail 308 includes a fourth-1 power rail protrusion 308*b* and a fourth-2 power rail protrusion 308*c* that protrude from the fourth power rail horizontal extension 308*a* in the second direction x.

That is, the third-1 power rail protrusion 306*b* may form a decoupling capacitor in the region in which it overlaps the first-1 power rail protrusion 302*b* of FIG. 9 in the third direction Z.

Further, the third-2 power rail protrusion 306*c* may form a decoupling capacitor in a region in which it overlaps the second-2 power rail protrusion 304*c* of FIG. 9 in the third direction z.

Further, the fourth-1 power rail protrusion 308*b* may form a decoupling capacitor in a region in which it overlaps the first-1 power rail protrusion 302*b* of FIG. 9 in the third direction Z.

Further, the fourth-2 power rail protrusion 308*c* may form a decoupling capacitor in a region in which it overlaps the first-2 power rail protrusion 304*c* of FIG. 9 in the third direction Z.

Therefore, capacity of the decoupling capacitor of the decoupling integrated circuit according to some example embodiments may be further increased.

Figure 11:
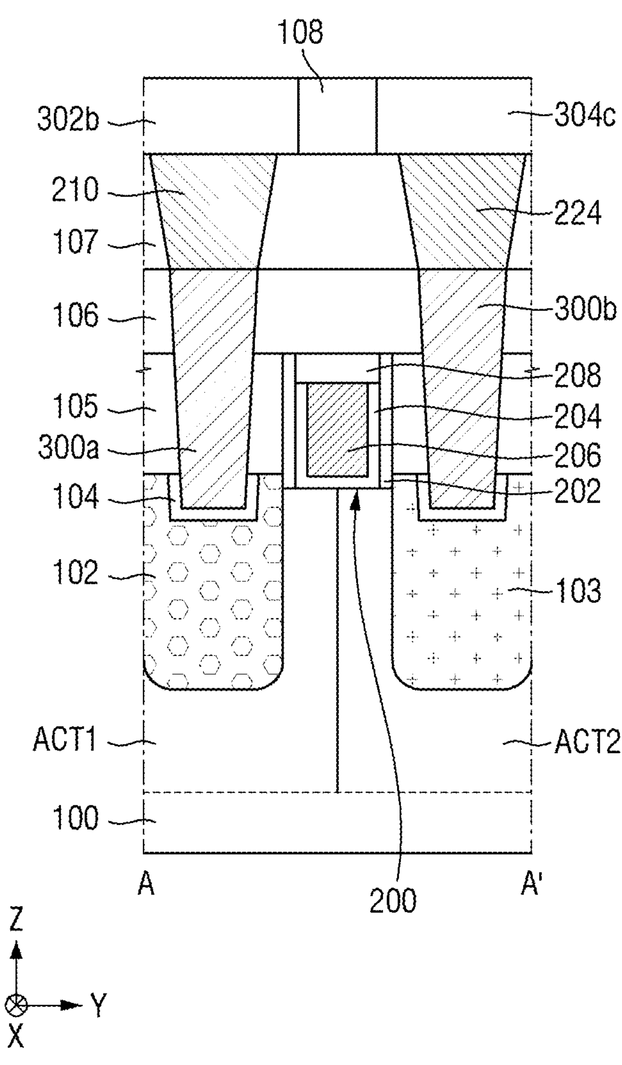
FIGS. 11 and 12 are cross-sectional views taken along a cutting line A-A' of FIG. 3.
Figure 12:
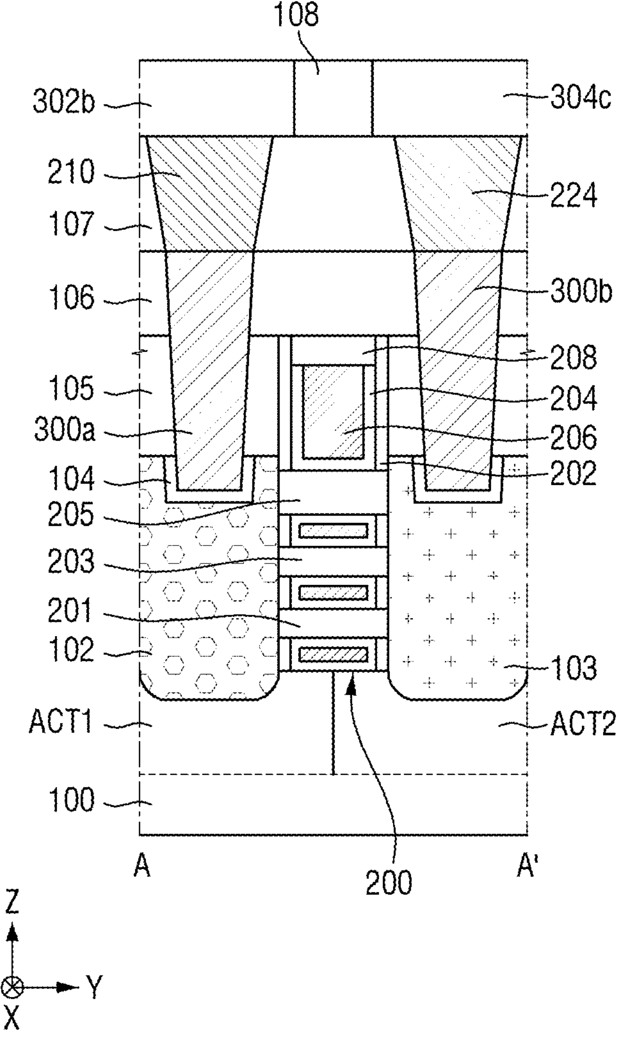

FIGS. 11 and 12 are cross-sectional views taken along a cutting line A-A' of FIG. 3.

Referring to FIG. 11, the decoupling integrated circuit 10 according to some example embodiments may have a fin type transistor (FinFET) structure including a channel region of a fin-type pattern shape.

The fin type transistor according to some example embodiments may be formed on the substrate 100 and the active region (e.g., the first active region ACT1 and/or the second active region ACT2) on the substrate 100.

The substrate 100 may be a silicon substrate or a silicon-on-insulator (SOI). In some example embodiments, the substrate 100 may include, but is not limited to, silicon germanium, SGOI (silicon germanium on insulator), indium antimonide, lead tellurium compounds, indium arsenide, indium phosphide, gallium arsenide or gallium antimonide.

The first active region ACT1 and the second active region ACT2 may be defined along the first direction y. The first active region ACT1 and the second active region ACT2 may be defined by a deep trench.

The first active region ACT1 may be a region in which a p-type transistor is formed. The first active region ACT1 may include, for example, a well region doped with n-type impurities. The first active region ACT1 may protrude from the substrate 100. The first active region ACT1 may include an epitaxial layer that is grown from the substrate 100.

The second active region ACT2 may be a region in which an n-type transistor is formed. The second active region ACT2 may include, for example, a well region doped with p-type impurities. The second active region ACT2 may protrude from the substrate 100. The second active region ACT2 may include an epitaxial layer that is grown from the substrate 100.

The fin type transistor according to some example embodiments includes a gate structure 200 (one is shown in this drawing, but a plurality of gate structures may be formed), source/drain regions 102 and 103, a silicide layer 104, a first interlayer insulating film 105, a second interlayer insulating film 106, a third interlayer insulating film 107, and a fourth interlayer insulating film 108.

The gate structure 200 may include a gate spacer 202, a gate insulating film 204, a gate electrode 206, and a capping pattern 208.

The structure of the gate structure 200 is not limited to this drawing.

The gate structure 200 and the source/drain regions 102 and 103 may extend in the second direction x on the first active region ACT1 and the second active region ACT2.

The gate spacer 202 may extend in the third direction z along both side walls of the gate insulating film 204. The gate insulating film 204 may be placed between the gate electrode 206 and the gate spacer 202 and below the capping pattern 208. The capping pattern 208 may be placed on each of the gate electrode 206 and the gate insulating film 204. The gate spacer 202, the gate insulating film 204, and the capping pattern 208 may include an insulating material.

The source/drain regions 102 and 103 may be formed by removing a part of the first active region ACT1 and the second active region ACT2 to form a recess, and then by filling the recess through an epitaxial process. The source/drain regions 102 and 103 may be formed on the first active region ACT1 and the second active region ACT2. Each of the source/drain regions 102 and 103 may be doped with impurity of a conductive type different from that of the semiconductor pattern formed on the first active region ACT1 and the second active region ACT2.

Source/drain contacts 300*a* and 300*b*, source/drain vias 210 and 224, a first-1 power rail protrusion 302*b*, and a second-2 power rail protrusion 304*c* are further included to apply electrical signals to the source/drain regions 102 and 103 of the fin-type transistor according to some example embodiments.

The silicide layer 104 may be placed between the source/drain regions 102 and 103 and each of the plurality of source/drain vias 210 and 224.

Each of the plurality of source/drain vias 210 and 224 may be electrically connected to the source/drain regions 102 and 103 through the silicide layer 104. Each of the plurality of source/drain vias 210 and 224 is formed in the third direction z and may extend in the second direction x.

The first interlayer insulating film 105 may surround the gate structure 200 and a plurality of source/drain contacts 300*a* and 300*c*.

The second interlayer insulating film 106 may be formed on the first interlayer insulating film 105. The second interlayer insulating film 106 may surround a plurality of source/drain contacts 300*a* and 300*c*.

The third interlayer insulating film 107 may be formed on the second interlayer insulating film 106. The third interlayer insulating film 107 may surround a plurality of source/drain vias 210 and 224.

The fourth interlayer insulating film 108 may be formed on the third interlayer insulating film 107. The fourth interlayer insulating film 108 may surround the metal lines (e.g., the first-1 power rail protrusion 302*b* and the second-2 power rail protrusion 304*c*).

The first interlayer insulating film 105 to the fourth interlayer insulating film 108 may include an insulating material.

That is, a decoupling capacitor may be formed between the first-1 power rail protrusion 302*b* to which the power supply voltage is supplied and the second-2 power rail protrusion 304*c* to which the ground voltage is supplied.

Referring to FIG. 12, the decoupling integrated circuit 10 according to some example embodiments may have a transistor (MBCFET™ (Multi-Bridge Channel Field Effect Transistor structure) structure or a GAA (Gate All Around) structure including a plurality of nanowires. The description overlapping FIG. 11 will be omitted, and the differences will be mainly described. The nanowires of the present disclosure may be in the form of wires or sheets.

A first nanowire 201 to a third nanowire 205 may be placed to be sequentially spaced apart in the third direction z on the substrate 100 or the first active region ACT1 and the second active region ACT2. The first nanowire 201 to the third nanowire 205 may extend in the second direction x.

The gate electrode 206, the gate insulating film 204 surrounding the gate electrode 206, and the gate spacer 202 formed on the side wall of the gate insulating film 204 may surround each of the first nanowire 201 to the third nanowire 205.

Although the gate spacer 202 is shown as being formed as a single film in this drawing, the present inventive concepts are not limited thereto. In other words, in some other example embodiments, the gate spacer 202 may be formed as multiple films.

The gate insulating film 204 may be placed between the gate electrode and the gate spacer 202, between the gate electrode 206 and the third nanowire 205, between the gate electrode 206 and the second nanowire 203, between the gate electrode 206 and the first nanowire 201, and between the gate electrode 206 and the first active region ACT1 and the second active region ACT2.

The source/drain regions 102 and 103 may be placed on at least one side of the first nanowire 201 to the third nanowire 205. Further, the source/drain regions 102 and 103 may be in contact with each of the first to third nanowires.

That is, a decoupling capacitor may be formed between the first-1 power rail protrusion 302*b* to which the power supply voltage is supplied and the second-2 power rail protrusion 304*c* to which the ground voltage is supplied.

Figure 13:
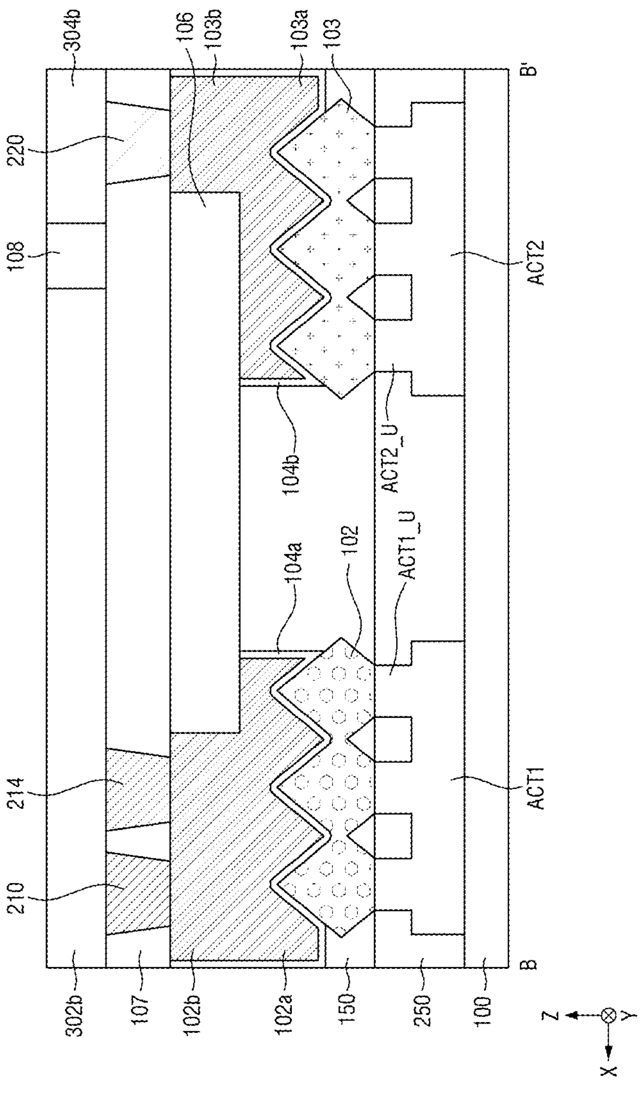
FIGS. 13 and 14 are cross-sectional views taken along cutting line B-B' of FIG. 3.
Figure 14:
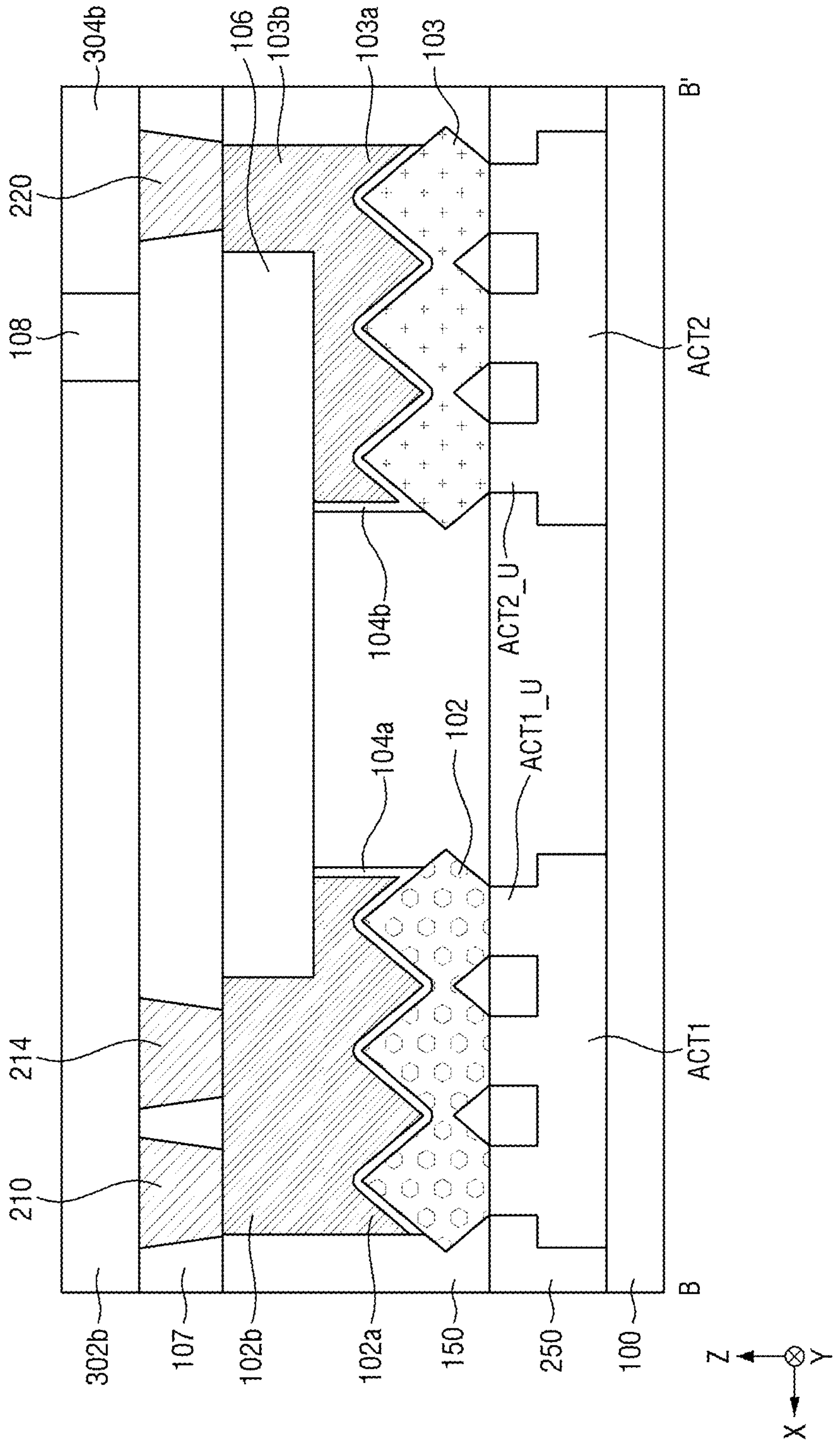

FIGS. 13 and 14 are cross-sectional views taken along cutting line B-B' of FIG. 3.

Referring to FIG. 13, each of a plurality of source/drain regions 102 and 103 may be formed on a corresponding one of the first active region ACT1 and the second active region ACT2 on the substrate 100. Descriptions that overlap the above descriptions will be omitted.

At least some of the plurality of source/drain regions 102 and 103 may be included in the source/drain regions of the plurality of transistors. The source/drain region 102 formed on the first active region ACT1 and the source/drain region 103 formed on the second active region ACT2 may be doped with impurities of different conductive types from each other.

A cell separation film 250 may be formed on the substrate 100. The cell separation film 250 may fill up a deep trench that distinguishes or defines the first active region ACT1 and the second active region ACT2. The cell separation film 250 may extend in the first direction y. The cell separation film 250 may include an insulating material.

A source/drain contact cutting pattern 150 may be placed on the cell separation film 250. The source/drain contact cutting pattern 150 may extend in the first direction y. The source/drain contact cutting pattern 150 may include an insulating material.

The source/drain contact cutting pattern 150 may cut the source/drain contact at the boundary of the cells. The source/drain contact cutting pattern 150 may be in contact with the source/drain contact (e.g., a first source/drain contact 102*a* and a second source/drain contact 103*a*).

A first source/drain upper contact 102*b* is formed on the first source/drain contact 102*a*, and the first source/drain upper contact 102*b* and the first source/drain contact 102*a* may fill up a trench defined by the silicide layer 104*a*.

Similarly, a second source/drain upper contact 103*b* is formed on the second source/drain contact 103*a*, and the second source/drain upper contact 103*b* and the second source/drain contact 103*a* may fill up the trench defined by the silicide layer 104*b*.

A second interlayer insulating film 106 is placed between the first source/drain upper contact 102*b*, the first source/drain contact 102*a*, the second source/drain upper contact 103*b*, and the second source/drain contact 103*a*. The second interlayer insulating film 106 may be placed on the first interlayer insulating film 105.

The source/drain via 210 may be placed on the first source/drain upper contact 102*b*. Further, the body contact 214 may be electrically connected to the first active region ACT1. Further, the source/drain via 220 may be placed on the second source/drain upper contact 103*b*.

The first-1 power rail protrusion 302*b* may be placed on the source/drain via 210 and the body contact 214, and the second-1 power rail protrusion 304*b* may be placed on the source/drain via 220.

The third interlayer insulating film 107 may be placed on the second interlayer insulating film 106, and the fourth interlayer insulating film 108 may be placed on the third interlayer insulating film 107.

That is, a decoupling capacitor may be formed between the first-1 power rail protrusion 302*b* to which the power supply voltage is supplied and the second-1 power rail protrusion 304*b* to which the ground voltage is supplied.

Differences from FIG. 13 will be mainly described referring to FIG. 14. In FIG. 14, the silicide layers 104*a* and 104*b* may be formed only on the source/drain regions 102 and 103, unlike FIG. 13. That is, the silicide layer 104*a* may not be formed on the outer side walls in the second direction x of the first source/drain contact 102*a* and the first source/drain upper contact 102*b*. Further, the silicide layer 104*b* may not be formed on the outer side wall in the opposite direction-x of the second direction x of the second source/drain contact 103*a* and the second source/drain upper contact 103*b*.

It goes without saying that decoupling integrated circuits according to some example embodiments are not limited to the above description and thus is also applicable to a GAA (Gate-All-Around) transistor and a planar transistor.

Another decoupling integrated circuit that serves as the decoupling capacitor will be described through a circuit diagram.

Figure 15:
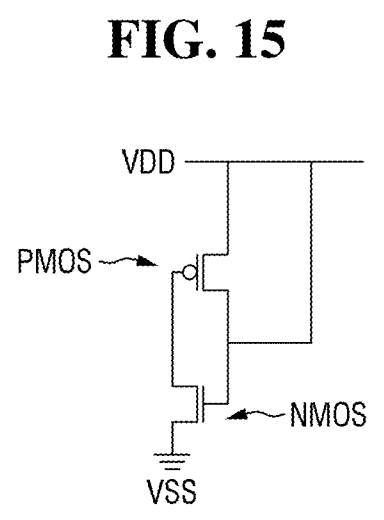

FIG. 15 is a circuit diagram showing another decoupling integrated circuit.

Referring to FIGS. 1 and 15, the decoupling integrated circuit includes an NMOS and a PMOS.

A source/drain of the PMOS is connected to a power supply voltage (e.g., the first power rail 302).

A source of the NMOS is connected to a ground voltage (e.g., the second power rail 304).

Further, the gate of the PMOS and the drain of the NMOS are connected to each other.

Also, the gate of the NMOS and the drain of the PMOS are connected to each other, and connected to the power supply voltage (e.g., the first power rail 302).

The decoupling integrated circuit of FIG. 15 may have a small decoupling capacity because only the capacitors formed at the gates of the PMOS and the NMOS serve as the decoupling capacitors. Therefore, in order to increase the decoupling capacity of the decoupling integrated circuit of FIG. 15, the structures associated with the power supply voltage (e.g., the first power rail 302) and/or the ground voltage (e.g., the second power rail 304) may be modified.

A decoupling integrated circuit according to some example embodiments in which the structure of the first power rail 302 and/or the second power rail 304 is modified to increase the decoupling capacity will be explained through the layout diagram of FIG. 16.

For reference, repeated parts of the contents explained above through FIG. 3 will not be explained.

Figure 16:
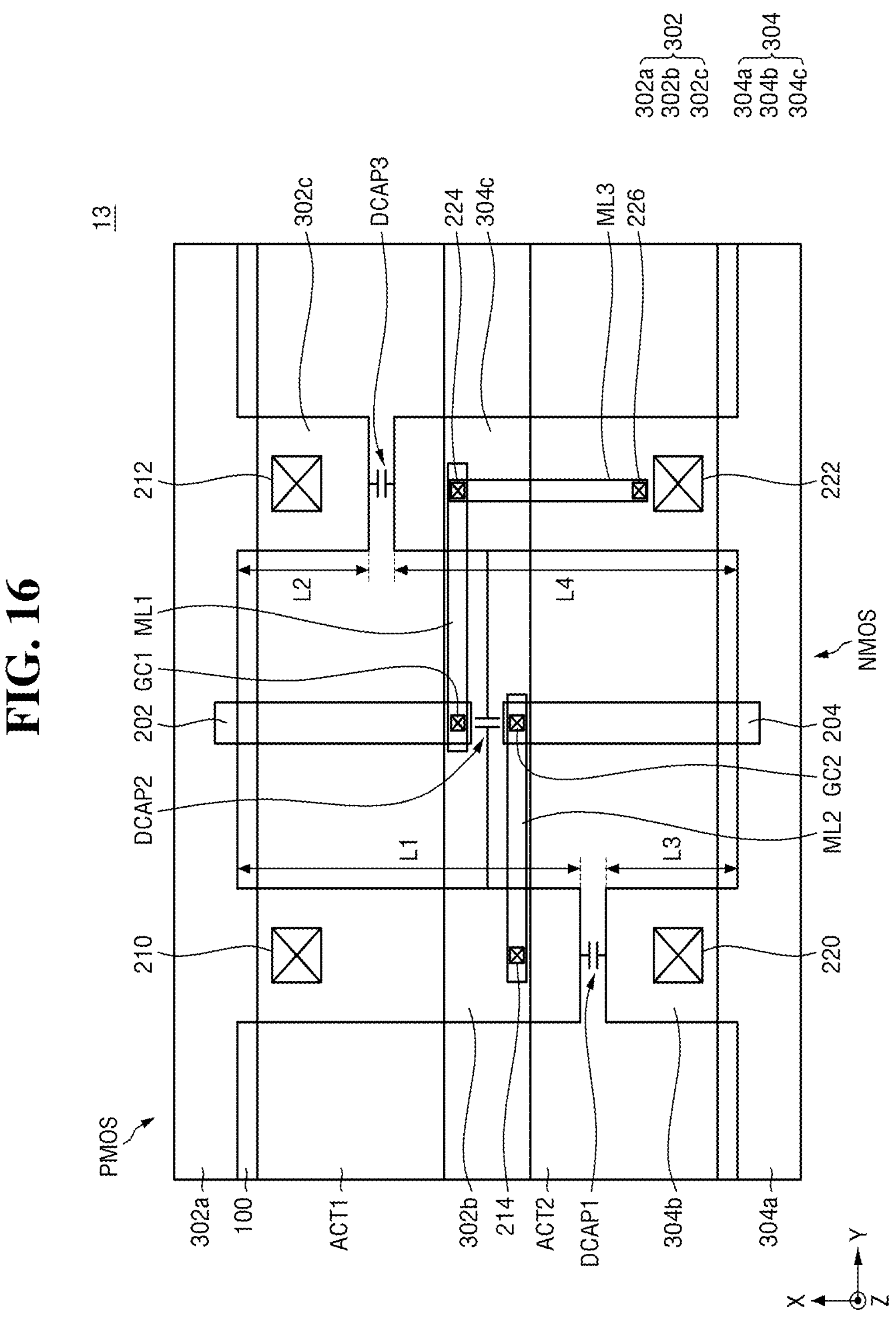
FIG. 16 is a layout diagram showing another decoupling integrated circuit that is configured to increase the decoupling capacity, according to some example embodiments.

FIG. 16 is a layout diagram showing another decoupling integrated circuit that is configured to increase a decoupling capacity, according to some example embodiments.

Referring to FIG. 16, the gate structures 202 and 204 of the decoupling integrated circuit 13 are placed in each active region, unlike the gate structure 200 of the decoupling integrated circuit 10 of FIG. 3.

For example, the first gate structure 202 is formed on the first active region ACT1, and the second gate structure 204 is formed on the second active region ACT2.

At this time, a first gate contact GC1 extending in the third direction z is formed on the first gate structure 202. The first gate contact GC1 is electrically connected to a first metal line ML1. The first metal line ML1 may be connected to the drain of the NMOS through the via 224.

For example, the first metal line ML1 may be connected to the third metal line ML3 through the via 224, and the third metal line ML3 may be connected to the drain of the NMOS through the via 226.

Further, a second gate contact GC2 extending in the third direction z is formed on the second gate structure 204. The second gate contact GC2 is electrically connected to the second metal line ML2. The second metal line ML2 may be supplied with the power supply voltage from the first power rail 302 through the via 214.

At this time, a MOS capacitor that serves as a decoupling capacitor may be formed below each of the first gate structure 202 and the second gate structure 204. However, because the decoupling capacity may not be sufficiently increased only by the decoupling capacitor formed through the first gate structure 202 and the second gate structure 204, as described through FIG. 3. According to the example embodiment illustrated in FIG. 16, the decoupling capacity of the decoupling integrated circuit 13 may be increased by modifying the structure of the first power rail 302 and/or the second power rail 304.

Figure 17:
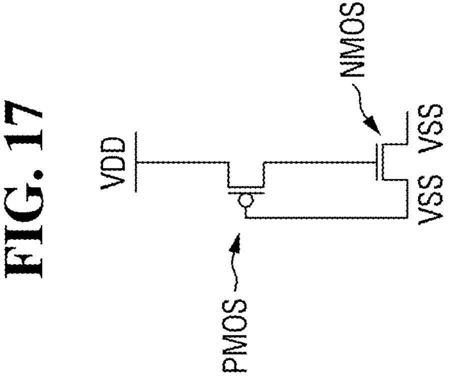
FIG. 17 is a circuit diagram showing another decoupling integrated circuit, according to some example embodiments.

FIG. 17 is a circuit diagram showing another decoupling integrated circuit.

Referring to FIGS. 1 and 17, the decoupling integrated circuit includes an NMOS and a PMOS.

A source of the PMOS is connected to the power supply voltage (e.g., the first power rail 302).

A source of the NMOS is connected to the ground voltage (e.g., the second power rail 304).

Also, the gate of the PMOS is connected to the drain of the NMOS.

Further, the gate of the NMOS and the drain of the PMOS are connected to each other.

In the decoupling integrated circuit of FIG. 17, the decoupling capacity may be small, because only the capacitor formed at the gates of the PMOS and the NMOS serves as the decoupling capacitor. Therefore, in order to increase the decoupling capacity of the decoupling integrated circuit of FIG. 17, structures associated with the power supply voltage (for example, the first power rail 302) and/or the ground voltage (for example, the second power rail 304) may be modified.

A decoupling integrated circuit according to some example embodiments in which the structure of the first power rail 302 and/or the second power rail 304 is modified to increase the decoupling capacity will be explained through the layout diagram of FIG. 18.

Figure 18:
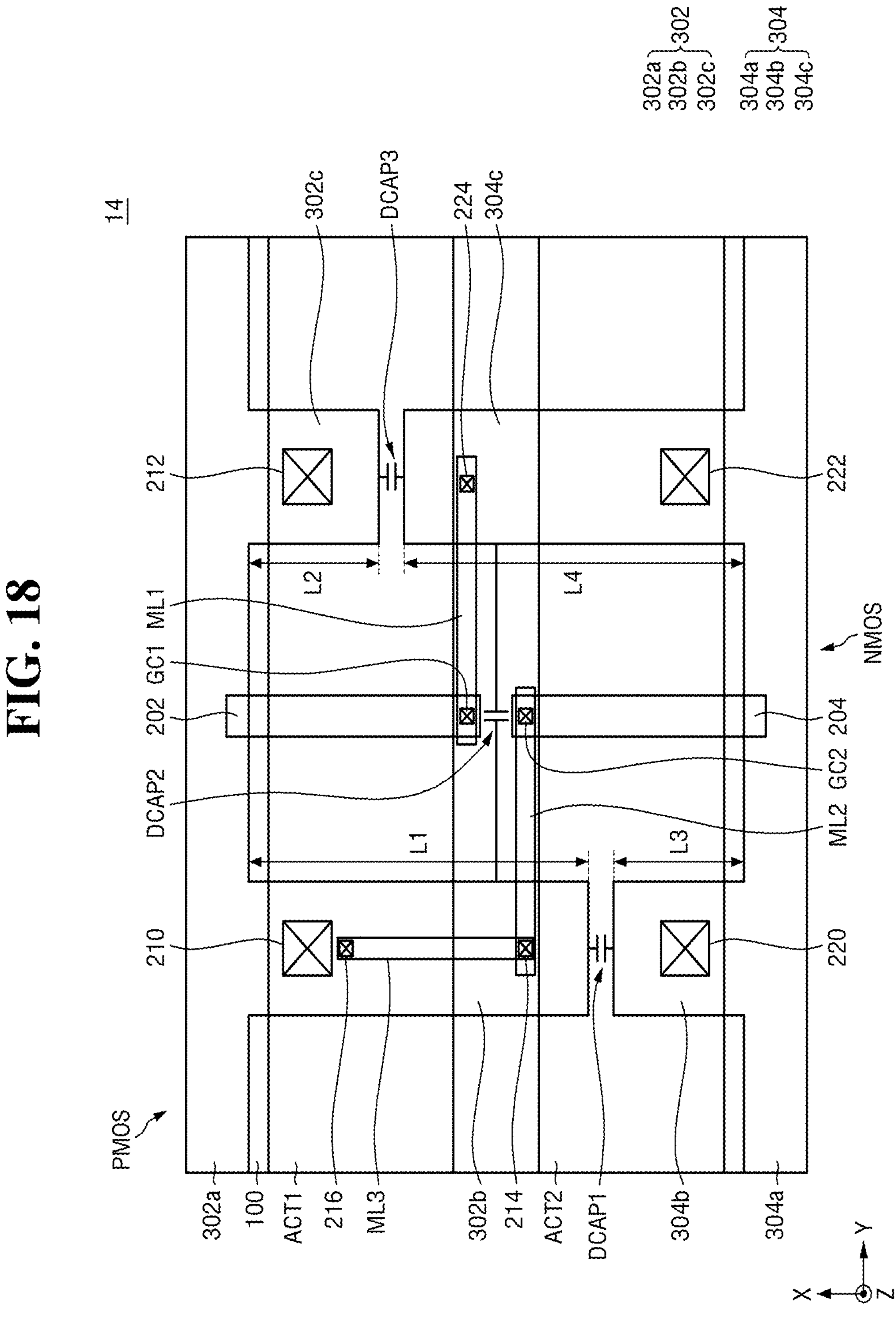
FIG. 18 is a layout diagram showing another decoupling integrated circuit that is configured to increase the decoupling capacity, according to some example embodiments.

For reference, repeated parts of contents explained above through FIG. 3 will not be explained FIG. 18 is a layout diagram showing another decoupling integrated circuit that is configured to increase the decoupling capacity, according to some example embodiments.

Referring to FIG. 18, the gate structures 202 and 204 of the decoupling integrated circuit 14 are placed on each active region, unlike the gate structure 200 of the decoupling integrated circuit 10 of FIG. 3.

For example, the first gate structure 202 is formed on the first active region ACT1, and the second gate structure 204 is formed on the second active region ACT2.

At this time, a first gate contact GC1 extending in the third direction z is formed on the first gate structure 202. The first gate contact GC1 is electrically connected to the first metal line ML1. The first metal line ML1 may be connected to the second power rail 222 through the via 224.

Further, a second gate contact GC2 extending in the third direction z is formed on the second gate structure 204. The second gate contact GC2 is electrically connected to the second metal line ML2. The second metal line ML2 may be connected to the drain of the PMOS through the via 214.

For example, the second metal line ML2 may be connected to the third metal line ML3 through the via 214, and the third metal line ML3 may be connected to the drain of the PMOS through the via 216.

At this time, a MOS capacitor that serves as a decoupling capacitor may be formed below each of the first gate structure 202 and the second gate structure 204. However, because the decoupling capacity may not be sufficiently increased only by the decoupling capacitor formed through the first gate structure 202 and the second gate structure 204. According to the example embodiment illustrated in FIG. 18, the decoupling capacity may be increased by modifying the structure of the first power rail 302 and/or the second power rail 304 as described through FIG. 3.

While the present inventive concepts have been particularly shown and described with reference to some example embodiments thereof, it will be understood by those of ordinary skill in the art that various changes in form and details may be made therein without departing from the spirit and scope of the present inventive concepts as defined by the following claims. It is therefore desired that the present example embodiments be considered in all respects as illustrative and not restrictive, reference being made to the appended claims rather than the foregoing description to indicate the scope of the inventive concepts.

What is claimed is:

1. A decoupling integrated circuit comprising:

a substrate including a first active region and a second active region;

the first active region extending in a first direction;

the second active region extending in the first direction and being spaced apart from the first active region in a second direction, the second direction intersecting the first direction;

a first power rail including a first power rail horizontal extension and a first-1 power rail protrusion and configured to receive a first power supply, the first power rail horizontal extension being apart from the first active region in a third direction opposite the second direction and extending in the first direction, the first-1 power rail protrusion protruding from the first power rail horizontal extension in the second direction; and a second power rail including a second power rail horizontal extension and a second-1 power rail protrusion and configured to receive a second power supply different from the first power supply, the second power rail horizontal extension being apart from the second active region in the second direction and extending in the first direction, the second-1 power rail protrusion protruding from the second power rail horizontal extension in the third direction, wherein the first-1 power rail protrusion overlaps at least a portion of the first active region and at least a portion of the second active region, the first-1 power rail protrusion is electrically connected to the first active region by a first contact structure and is electrically isolated from the second active region, the second-1 power rail protrusion is electrically connected to the second active region by a second contact structure and is electrically isolated from the first active region, the second-1 power rail protrusion overlaps a part of the second active region to provide a first decoupling capacitor between the first-1 power rail protrusion and the second-1 power rail protrusion, the second power rail includes a second-2 power rail protrusion protruding from the second power rail horizontal extension and extending in the third direction, the first-1 power rail protrusion and the second-1 power rail protrusion are spaced apart from the second-2 power rail protrusion in the first direction, and at least a part of the first-1 power rail protrusion and at least a part of the second-2 power rail protrusion overlap each other in the first direction and provide a second decoupling capacitor.

2. The decoupling integrated circuit of claim 1, wherein the first-1 power rail protrusion has a first length in the second direction, and the first power rail further includes a first-2 power rail protrusion protruding from the first power rail horizontal extension in the second direction, the first-2 power rail protrusion spaced apart from the first-1 power rail protrusion in the first direction, the first-2 power rail protrusion having a second length in the second direction.

3. The decoupling integrated circuit of claim 2, wherein the first length and the second length are different from each other.

4. The decoupling integrated circuit of claim 1, wherein the second-1 power rail protrusion has a third length in the second direction, and the second power rail further includes a second-2 power rail protrusion protruding from the second power rail horizontal extension in the third direction, the second-2 power rail protrusion spaced apart from the second-1 power rail protrusion in the first direction, the second-2 power rail protrusion having a fourth length in the second direction.

5. The decoupling integrated circuit of claim 4, wherein the third length and the fourth length are different from each other.

6. The decoupling integrated circuit of claim 4, wherein the first power rail further includes a first-2 power rail protrusion protruding from the first power rail horizontal extension in the second direction, the first-2 power rail protrusion spaced apart from the first-1 power rail protrusion in the first direction, the first-2 power rail protrusion spaced apart from the second-2 power rail protrusion in the third direction, and the decoupling integrated circuit further includes a second decoupling capacitor having the first-2 power rail protrusion and the second-2 power rail protrusion as electrodes.

7. The decoupling integrated circuit of claim 1, further comprising:

a gate structure spaced apart from the first-1 power rail protrusion in the first direction, extending in the second direction, and overlapping the first active region and the second active region.

8. A decoupling integrated circuit comprising:

a substrate including a first active region and a second active region;

the first active region extending in a first direction;

the second active region extending in the first direction, and being spaced apart from the first active region in a second direction, the second direction intersecting the first direction;

a first power rail including a first power rail horizontal extension and a first-1 power rail protrusion and configured to receive a first power supply, the first power rail horizontal extension being apart from the first active region in a third direction opposite to the second direction and extending in the first direction, the first-1 power rail protrusion protruding from the first power rail horizontal extension in the second direction; and a second power rail including a second power rail horizontal extension and a second-1 power rail protrusion and configured to receive a second power supply different from the first power supply, the second power rail horizontal extension being apart from the second active region in the second direction and extending in the first direction, the second-1 power rail protrusion protruding from the second power rail horizontal extension in the third direction, wherein the first-1 power rail protrusion overlaps the first active region, the first-1 power rail protrusion is electrically connected to the first active region by a first contact structure and is electrically isolated from the second active region, the second-1 power rail protrusion is electrically connected to the second active region by a second contact structure and is electrically isolated from the first active region, the second-1 power rail protrusion overlaps the second active region, the first-1 power rail protrusion and the second-1 power rail protrusion are spaced apart in the first direction, and the first-1 power rail protrusion and the second-1 power rail protrusion at least partially overlap each other in the first direction to provide a first decoupling capacitor.

9. The decoupling integrated circuit of claim 8, wherein the first-1 power rail protrusion has a first length in the second direction, the second-1 power rail protrusion has a second length in the second direction, and the first length and the second length are different from each other.

10. The decoupling integrated circuit of claim 8, wherein the first power rail further includes a first-2 power rail protrusion protruding from the first power rail horizontal extension in the second direction and being spaced apart from the first-1 power rail protrusion in the first direction, and the first-2 power rail protrusion is spaced apart from the second-1 power rail protrusion in the third direction to provide a second decoupling capacitor.

11. The decoupling integrated circuit of claim 10, wherein the second power rail further includes a second-2 power rail protrusion protruding from the second power rail horizontal extension in the third direction and being spaced apart from the second-1 power rail protrusion in the first direction, and the second-2 power rail protrusion is spaced apart from the first-1 power rail protrusion in the second direction to provide a third decoupling capacitor.

12. The decoupling integrated circuit of claim 11, wherein the first-1 power rail protrusion has a first length in the second direction, the first-2 power rail protrusion has a second length in the second direction, the second-1 power rail protrusion has a third length in the second direction, the second-2 power rail protrusion has a fourth length in the second direction, and the first length, the second length, the third length, and the fourth length are different from each other.

13. The decoupling integrated circuit of claim 8, further comprising:

a gate structure between the first-1 power rail protrusion and the second-1 power rail protrusion, extending in the second direction, and overlapping the first active region and the second active region.

14. A decoupling integrated circuit comprising:

a substrate including a first active region and a second active region;

the first active region extending in a first direction;

the second active region extending in the first direction, and being spaced apart from the first active region in a second direction, the second direction intersecting the first direction;

a first power rail including a first power rail horizontal extension and a first-1 power rail protrusion and configured to receive a first power supply, the first power rail horizontal extension being apart from the first active region in a third direction opposite to the second direction and extending in the first direction, the first-1 power rail protrusion protruding from the first power rail horizontal extension in the second direction; and a second power rail including a second power rail horizontal extension, a second-1 power rail protrusion and a second-2 power rail protrusion and configured to receive a second power supply different from the first power supply, the second power rail horizontal extension being apart from the second active region in the second direction and extending in the first direction, the second-1 power rail protrusion protruding from the second power rail horizontal extension in the third direction, the second-2 power rail protrusion protruding from the second power rail horizontal extension in the third direction and being spaced apart from the second-1 power rail protrusion in the first direction, wherein the first-1 power rail protrusion overlaps the first active region, the first-1 power rail protrusion is electrically connected to the first active region by a first contact structure and is electrically isolated from the second active region, the second-1 power rail protrusion is electrically connected to the second active region by a second contact structure and is electrically isolated from the first active region, the second-1 power rail protrusion overlaps a part of the second active region and is spaced apart from the first-1 power rail protrusion in the second direction to provide a first decoupling capacitor between the first-1 power rail protrusion and the second-1 power rail protrusion, and the second-2 power rail protrusion overlaps the second active region, the first-1 power rail protrusion and the second-2 power rail protrusion are spaced apart in the first direction, and the first-1 power rail protrusion and the second-2 power rail protrusion at least partially overlap each other in the first direction to provide a second decoupling capacitor.

15. The decoupling integrated circuit of claim 14, further comprising:

a gate structure between the first-1 power rail protrusion and the second-2 power rail protrusion, extending in the second direction, and overlapping the first active region and the second active region.

16. The decoupling integrated circuit of claim 14, wherein the first power rail further includes a first-2 power rail protrusion protruding from the first power rail horizontal extension in the second direction and being spaced apart from the first-1 power rail protrusion in the first direction, and the first-2 power rail protrusion is spaced apart from the second-2 power rail protrusion in the third direction to provide a third decoupling capacitor.

* * * * *